(12) United States Patent
Huang et al.

(10) Patent No.: US 10,008,489 B2
(45) Date of Patent: *Jun. 26, 2018

(54) ELECTROSTATIC DISCHARGE PROTECTION SEMICONDUCTOR DEVICE

(71) Applicant: UNITED MICROELECTRONICS CORP., Hsin-Chu (TW)

(72) Inventors: Chung-Yu Huang, Tainan (TW); Kuan-Cheng Su, Taipei (TW); Tien-Hao Tang, Hsinchu (TW); Ping-Chen Chang, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/724,825

(22) Filed: May 29, 2015

(65) Prior Publication Data

US 2016/0260700 A1 Sep. 8, 2016

(30) Foreign Application Priority Data

Mar. 6, 2015 (TW) .............................. 104107206 A

(51) Int. Cl.
*H01L 27/02* (2006.01)
*H01L 29/78* (2006.01)
*H01L 29/08* (2006.01)

(52) U.S. Cl.
CPC ........ *H01L 27/0255* (2013.01); *H01L 27/027* (2013.01); *H01L 29/0873* (2013.01); *H01L 29/7818* (2013.01)

(58) Field of Classification Search
CPC ............. H01L 29/7818; H01L 29/0873; H01L 27/0248; H01L 27/0292; H01L 29/66613;
(Continued)

(56) References Cited

U.S. PATENT DOCUMENTS 5,719,733 A * 2/1998 Wei ...................... H01L 27/0259
257/173
6,894,320 B2 * 5/2005 Tsuji ................... H01L 27/0262
257/173
(Continued)

FOREIGN PATENT DOCUMENTS

CN 203659860 U * 6/2014

OTHER PUBLICATIONS

Ming-Dou Ker et al., On-Chip ESD Protection Design With Substrate-Triggered Technique for Mixed-Voltage I/O Circuits in Subquarter-Micrometer CMOS Process, Feb. 24, 2004.

*Primary Examiner* — Bitew Dinke
(74) *Attorney, Agent, or Firm* — Winston Hsu

(57) ABSTRACT

An electrostatic discharge protection semiconductor device includes a substrate, a gate set positioned on the substrate, a source region and a drain region formed in the substrate respectively at two sides of the gate set, at least a first doped region formed in the drain region, and at least a second doped region formed in the substrate. The source region and the drain region include a first conductivity type, the first doped region and the second doped region include a second conductivity type, and the first conductivity and the second conductivity type are complementary to each other. The first doped region and the second doped region are electrically connected to each other.

15 Claims, 11 Drawing Sheets

(58) Field of Classification Search
CPC .......... H01L 29/66681; H01L 29/7816; H01L 27/0255; H01L 27/027
See application file for complete search history.

(56) References Cited

U.S. PATENT DOCUMENTS

| | | | | |
|---|---|---|---|---|
| 7,379,283 B1* | 5/2008 | Farrenkopf | ......... | H01L 27/0262 361/111 |
| 7,679,870 B2 | 3/2010 | Lin et al. | | |
| 8,878,304 B2 | 11/2014 | Fang et al. | | |
| 8,879,220 B2 | 11/2014 | Lin et al. | | |
| 9,640,524 B2* | 5/2017 | Huang | ............... | H01L 27/0259 |
| 9,653,450 B2* | 5/2017 | Huang | ............... | H01L 29/7819 |
| 9,673,189 B2* | 6/2017 | Huang | ............... | H01L 27/0262 |
| 9,691,752 B1* | 6/2017 | Chao | .................. | H01L 27/0255 |
| 9,716,087 B1* | 7/2017 | Huang | ............... | H01L 27/0262 |
| 2002/0037621 A1* | 3/2002 | Kawazoe | ......... | H01L 27/0248 438/296 |
| 2002/0149067 A1* | 10/2002 | Mitros | .................. | H01L 21/761 257/409 |
| 2005/0151160 A1* | 7/2005 | Salcedo | ............. | H01L 29/7436 257/173 |
| 2006/0278924 A1* | 12/2006 | Kao | .................... | H01L 29/0653 257/339 |
| 2011/0051298 A1* | 3/2011 | Lai | ...................... | H01L 27/0266 361/56 |
| 2011/0249500 A1* | 10/2011 | Cha | .................. | H01L 21/28273 365/185.08 |
| 2012/0305984 A1* | 12/2012 | Campi, Jr. | .......... | H01L 27/0262 257/124 |
| 2013/0242448 A1* | 9/2013 | Salcedo | .............. | H01L 27/0259 361/111 |
| 2013/0334600 A1* | 12/2013 | Hsu | .................. | H01L 29/66681 257/337 |
| 2014/0035033 A1* | 2/2014 | Lim | .................... | H01L 29/7817 257/338 |
| 2015/0187928 A1* | 7/2015 | Wang | .................. | H01L 27/0727 257/337 |
| 2015/0194420 A1* | 7/2015 | Wang | .................. | H01L 27/0262 257/133 |
| 2015/0349050 A1* | 12/2015 | Fang | .................... | H01L 27/0259 257/339 |
| 2016/0035884 A1* | 2/2016 | Fang | .................. | H01L 29/1095 257/343 |
| 2017/0194315 A1* | 7/2017 | Huang | ............... | H01L 27/0277 |
| 2017/0221876 A1* | 8/2017 | Huang | ............... | H01L 27/0248 |

* cited by examiner

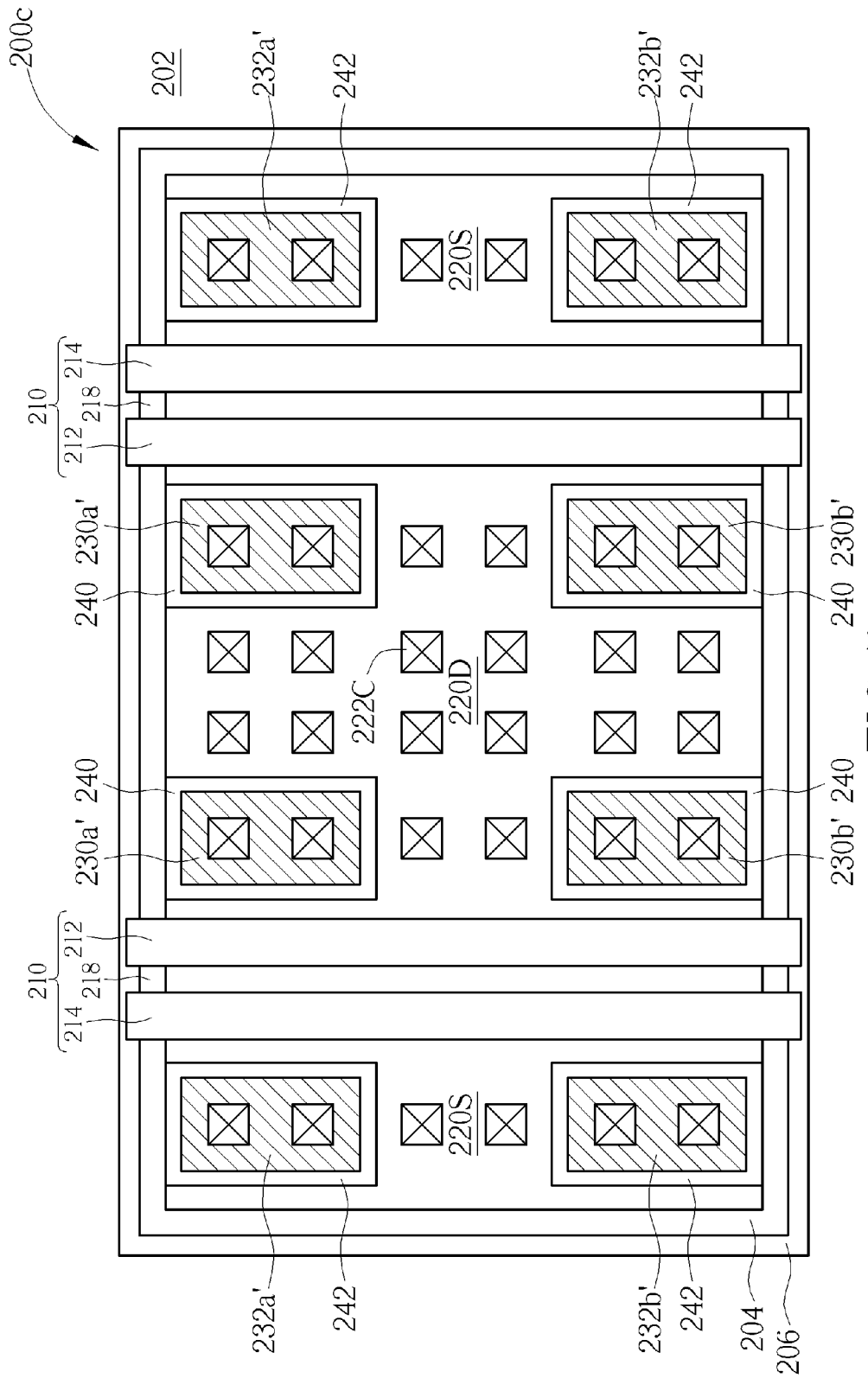

ELECTROSTATIC DISCHARGE PROTECTION SEMICONDUCTOR DEVICE

BACKGROUND OF THE INVENTION

1. Field of the Invention

The invention relates to an electrostatic discharge (hereinafter abbreviated as ESD) protection semiconductor device, and more particularly, to an ESD protection semiconductor device with self-triggered structure.

2. Description of the Prior Art

With the advancement of technology, the development of semiconductor process is ongoing. A modern chip is therefore allowed to have a plurality of various electronic circuits configured within. For example, the integrated circuits (ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for core circuits and I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip, and this unwanted condition is named electrostatic discharge (ESD). As products based on ICs become more delicate, they also become more vulnerable to the impacts from external environment. And thus, it is assumed that ESD is a constant threat to the modern electronics. As a countermeasure against to the ESD issue, there have been proposed ESD protection circuits/devices. Typically, during a normal IC operation, the ESD protection device is turned off. However when an ESD event occurs, the ESD protection device must be quickly triggered, so that the ESD current is bypassed from the inner circuit. There is therefore a continuing need in the semiconductor processing art to develop an ESD protection device having lower trigger voltage which can be quickly turned on in order to render immediate protection to the inner circuit. That is, lower threshold voltage (Vt) for the ESD protection device is required. In the meantime, demand for improving device robustness is increased.

SUMMARY OF THE INVENTION

According to the claimed invention, an ESD protection semiconductor device is provided. The ESD protection semiconductor device includes a substrate, a gate set positioned on the substrate, a source region and a drain region formed in the substrate respectively at two sides of the gate set, at least a first doped region formed in the drain region, and at least a second doped region formed in the substrate. The source region and the drain region include a first conductivity type, the first doped region and the second doped region include a second conductivity type, and the first conductivity and the second conductivity type are complementary to each other. More important, the first doped region and the second doped region are electrically connected to each other.

According to the ESD protection semiconductor device provided by the present invention, the first doped region formed in the drain region and the second doped region formed in the substrate construct a self-triggered structure, therefore the threshold voltage of the ESD protection semiconductor device is reduced while the turn-on speed and the device robustness of the ESD protection semiconductor device are improved. Furthermore, the ESD protection semiconductor device provided by the present invention includes the gate set, and the gate set can include single gate, multi gate, or multi gate group. Therefore, the ESD protection semiconductor device provided by the present invention is able to be integrated into single-gate metal-oxide-semiconductor (hereinafter abbreviated as MOS) transistor device, cascode transistor device, and multi-gate MOS transistor. Additionally, by forming well regions of different conductivity types in the substrate, the ESD protection semiconductor device provided by the present invention is able to be integrated with lateral-diffusion metal-oxide-semiconductor (hereinafter abbreviated as LDMOS) transistor approach. In other words, the ESD protection semiconductor device provided by the present invention is able to be integrated with various transistor approaches, thus product flexibility and functionality of the ESD protection semiconductor device are both improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a schematic drawing illustrating a layout structure of the ESD protection semiconductor device provided by still another modification of the present invention.

DETAILED DESCRIPTION

Figure 1A:
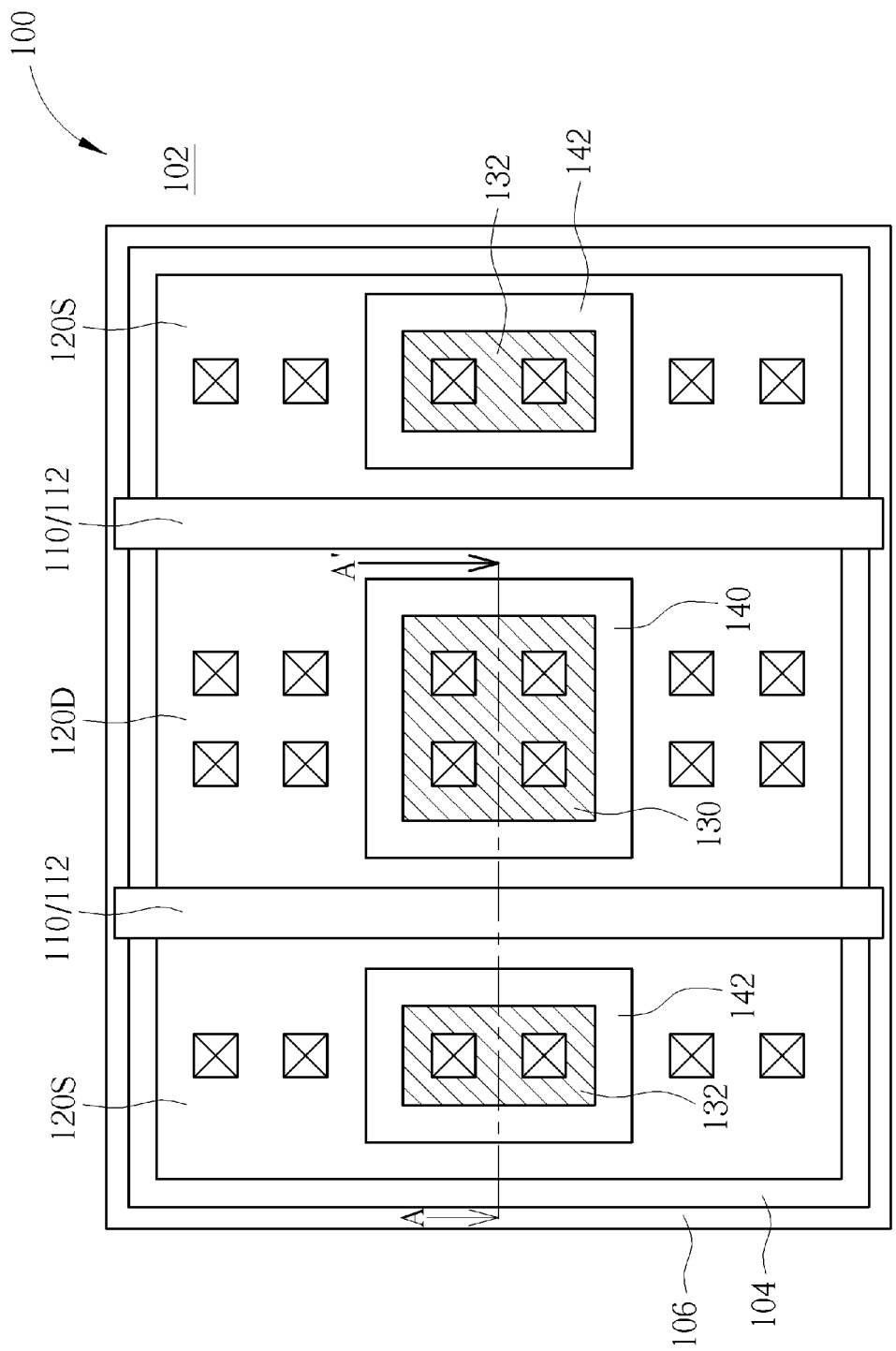
FIG. 1A is a schematic drawing illustrating a layout structure of an ESD protection semiconductor device provided by a first preferred embodiment of the present invention.
Figure 1B:
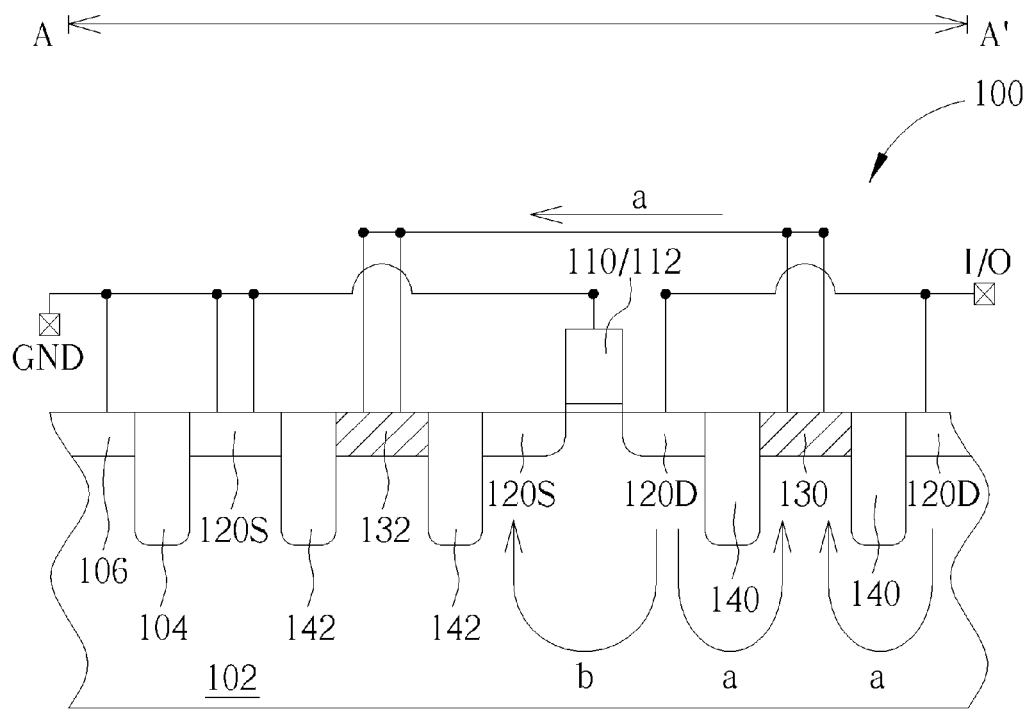
FIG. 1B is a schematic drawing illustrating the ESD protection semiconductor device provided by the first preferred embodiment and also is a cross-sectional view taken along a Line A-A' of FIG. 1A.
Figure 1C:
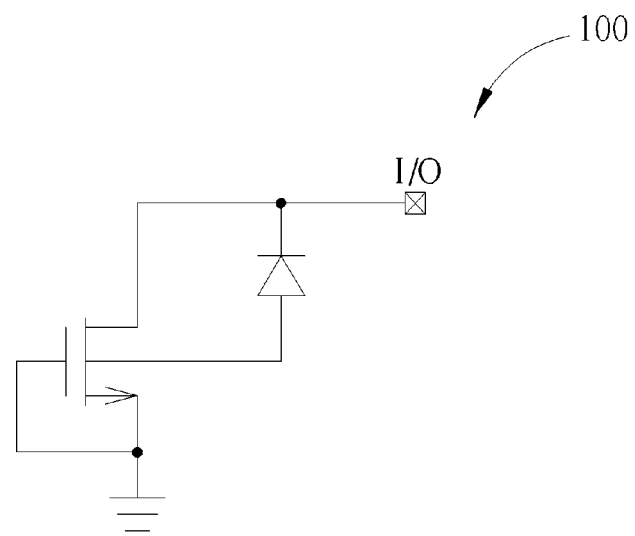
FIG. 1C is a circuit diagram of the ESD protection semiconductor device provided by the first preferred embodiment.

Please refer to FIGS. 1A-1C, wherein FIG. 1A is a schematic drawing illustrating a layout structure of an ESD protection semiconductor device provided by a first preferred embodiment of the present invention, FIG. 1B is a schematic drawing illustrating the ESD protection semiconductor device provided by the first preferred embodiment and also is a cross-sectional view taken along a Line A-A' of FIG. 1A, and FIG. 1C is a circuit diagram of the ESD protection semiconductor device provided by the first preferred embodiment. As shown in FIG. 1A and FIG. 1B, the ESD protection semiconductor device 100 provided by the preferred embodiment includes a substrate, and the substrate includes a well region 102. A gate set 110 is positioned on the substrate and the well region 102. In the preferred embodiment, the gate set 110 includes a single gate structure 112. It is well-known to those skilled in the art that the single gate structure 112 includes a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 100 further includes a source region 120S and a drain region 120D formed in the substrate/the well region 102 respectively at two sides of the gate set 110 (that is the single gate structure 112). The source region 120S and the drain region 120D include a first conductivity type while the well region 102 includes a second conductivity type, and the first conductivity type and the second conductivity type are complementary to each other. For example, the first conductivity type is an n type and the second conductivity type is a p type in the preferred embodiment. However, it should be easily realized to those skilled in the art that the first conductivity type can be the p type and the second conductivity type can be the n type. Accordingly, the preferred embodiment provides an n-source region 120S and an n-drain region 120D formed in a p-well region 102. Furthermore, the ESD protection semiconductor device 100 includes an isolation structure 104 and a guard ring 106 including the second conductivity type. The isolation structure 104 and the guard ring 106 surround the ESD protection semiconductor device 100 and electrically isolate the ESD protection semiconductor device 100 from other device. In the preferred embodiment, the isolation structure 104 preferably includes a shallow trench isolation (hereinafter abbreviated as STI) structure, but not limited to this.

Please still refer to FIG. 1A and FIG. 1B. The ESD protection semiconductor device 100 provided by the preferred embodiment further includes at least a first doped region 130 formed in the drain region 120D and at least a second doped region 132 formed in the substrate, particularly in the source region 120S. As shown in FIG. 1A, the first doped region 130 is positioned in a center of the drain region 120D and the second doped region 132 is also positioned in a center of the source region 120S, but not limited to this. The modifications to the arrangement of the first doped region 130 and the drain region 120D and to the arrangement of the second doped region 132 and the source region 120S are exemplarily shown in FIGS. 3-5 and will be detailed thereafter. It is noteworthy that though the first doped region 130 is formed in the drain region 120D, the first doped region 130 is spaced apart from the drain region 120D by a first blocking structure 140. In the same concept, though the second doped region 132 is formed in the source region 120S, the second doped region 132 is spaced apart from the source region 120S by a second blocking structure 142. As shown in FIG. 1A and FIG. 1B, the first blocking structure 140 surrounds the first doped region 130 and therefore isolates the first doped region 130 from the drain region 120D. Also as shown in FIG. 1A and FIG. 1B, the second blocking structure 142 surrounds the second doped region 132 and therefore isolates the second doped region 132 from the source region 120S. In the preferred embodiment, the first blocking structure 140 and the second blocking structure 142 include STI structure. However, the first blocking structure 140 and the second blocking structure 142 can include dummy gate structure or salicide block (hereinafter abbreviated as SAB) structure. Furthermore, both of the first doped region 130 and the second doped region 132 include the second conductivity type. That is, the preferred embodiment provides a p-typed first doped region 130 and a p-typed second doped region 132.

More important, the first doped region 130 formed in the drain region 120D and the second doped region 132 formed in the source region 120S are electrically connected to each other as shown in FIG. 1B. Furthermore, the gate set 110 (that is the single gate structure 112), the source region 120S and the guard ring 106 are electrically connected to a ground pad GND, and the drain region 120D is electrically connected to an input/output pad I/O. As shown in FIG. 1B and FIG. 1C, when an ESD event occurs, the ESD surges will be diverted to the ground by the gate set 110/112, which is electrically connected to the ground pad GND. More important, the n-drain region 120D, the p-well region 102 and the p-typed first doped region 130 construct a diode and this diode is self-triggered during the ESD event. Consequently, the ESD current is bypassed from the drain region 120D to the first doped region 130 and to the second doped region 132 as arrows "a" depicted. Moreover, the n-drain region 120D, the p-well region 102 and the n-source region 120S construct an npn bipolar junction transistor (hereinafter abbreviated as BJT). This npn-BJT is also self-triggered during the ESD events, and thus the ESD current is bypassed from the drain region 120D to the source region 120S, which is electrically connected to the ground pad GND, as arrow "b" depicted. Briefly speaking, the preferred embodiment provides the self-triggered structures (including the diode and the BJT) for bypassing the ESD currents.

Accordingly, the ESD protection semiconductor device 100 provided by the preferred embodiment is a single-gate MOS transistor device including a self-triggered structure. And the self-triggered structure is a diode constructed by the first doped region 130 formed in the drain region 120D and the second doped region 132 formed in the drain region 120D. And the first doped region 130 is electrically connected to the second doped region 132. Consequently, the ESD currents can be bypassed by the self-triggered diode. Therefore, the threshold voltage of the ESD protection semiconductor device 100 is efficaciously reduced and thus the turn-on speed is improved. Since the self-triggered diode serves as the bypass for ESD, damage caused by the ESD event is avoided and thus device robustness of the ESD protection semiconductor device 100 is improved. More important, since the bypass is a self-triggered structure, no leakage is found when the ESD protection semiconductor device 100 is turned off. Additionally, according to the preferred embodiment, formation of the first doped region 130 and the second doped region 132 can be integrated in the state-of-the-art semiconductor manufacturing process without increasing process complexity and cost.

Figure 2A:
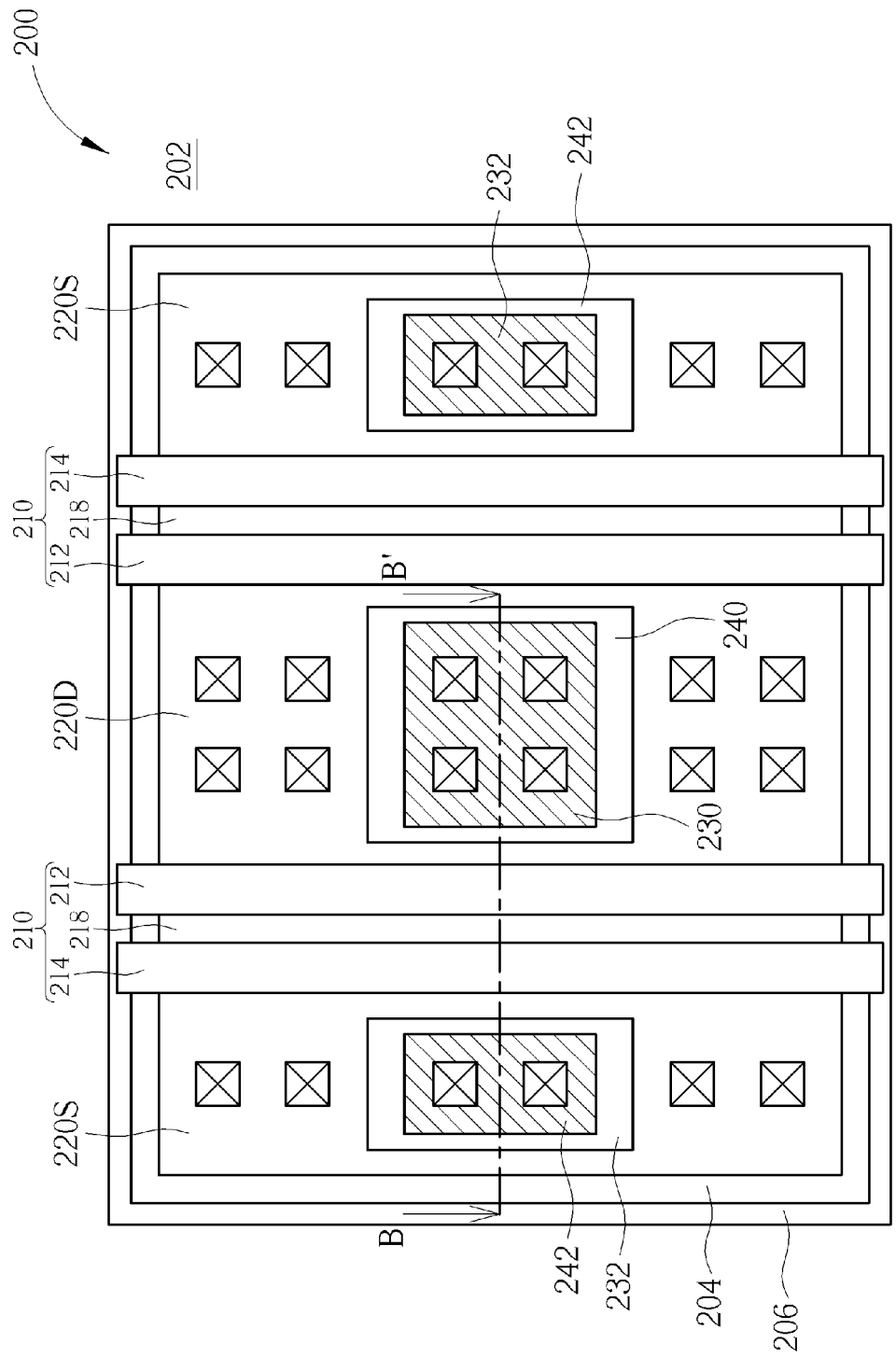
FIG. 2A is a schematic drawing illustrating a layout structure of an ESD protection semiconductor device provided by a second preferred embodiment of the present invention.
Figure 2B:
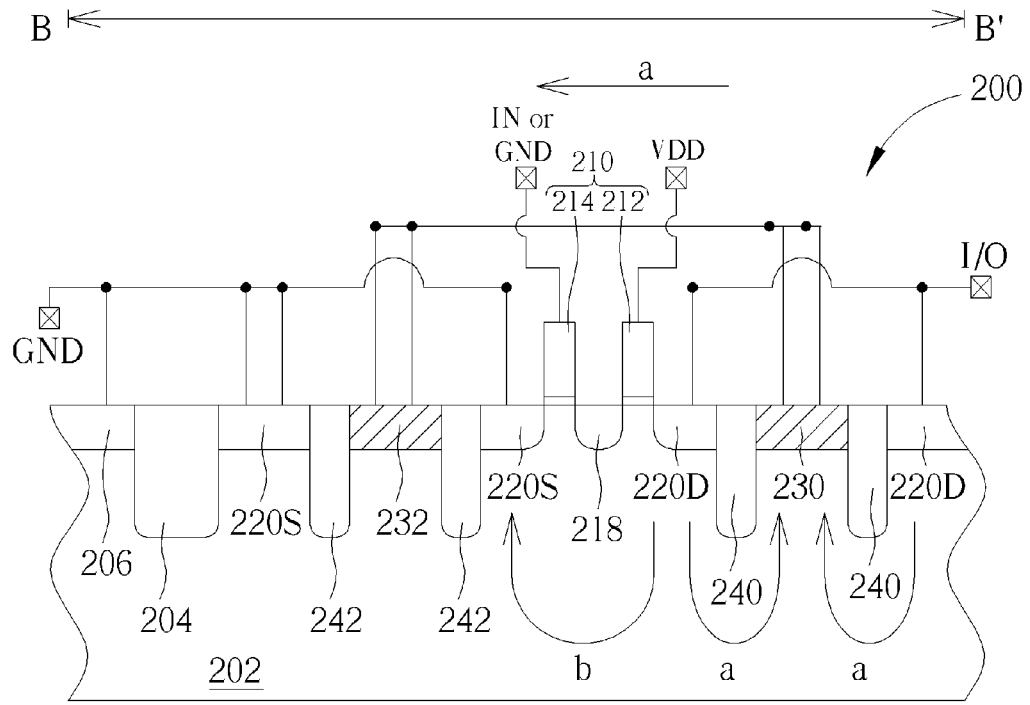
FIG. 2B is a schematic drawing illustrating the ESD protection semiconductor device provided by the second preferred embodiment and also is a cross-sectional view taken along a Line B-B' of FIG. 2A.
Figure 2C:
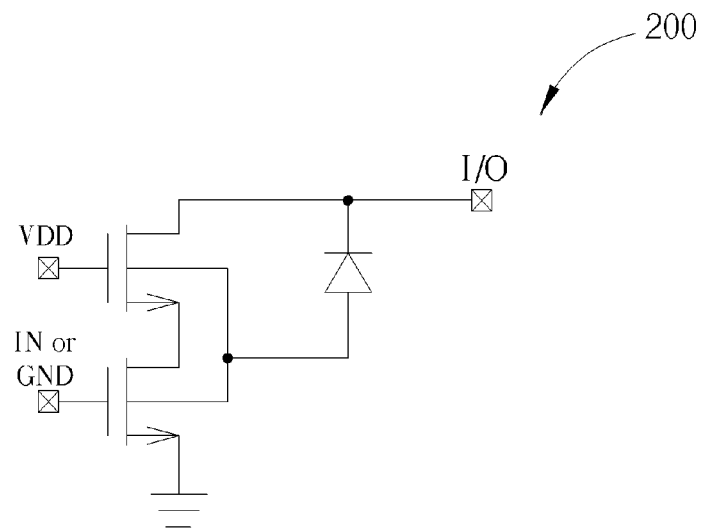
FIG. 2C is a circuit diagram of the ESD protection semiconductor device provided by the second preferred embodiment.

Please refer to FIGS. 2A-2C, wherein FIG. 2A is a schematic drawing illustrating a layout structure of an ESD protection semiconductor device provided by a second preferred embodiment of the present invention, FIG. 2B is a schematic drawing illustrating the ESD protection semiconductor device provided by the second preferred embodiment and also is a cross-sectional view taken along a Line B-B' of FIG. 2A, and FIG. 2C is a circuit diagram of the ESD protection semiconductor device provided by the second preferred embodiment. As shown in FIG. 2A and FIG. 2B, the ESD protection semiconductor device 200 provided by the preferred embodiment includes a substrate, and the substrate includes a well region 202. A gate set 210 is positioned on the substrate and the well region 202. In the preferred embodiment, the gate set 210 includes a first gate structure 212, a second gate structure 214 and a third doped region 218. As shown in FIG. 2A and FIG. 2B, the third doped region 218 is positioned in between the first gate structure 212 and the second gate structure 214. Therefore the first gate structure 212 and the second gate structure 214 are spaced apart from each other by the third doped region 218. However, the first gate structure 212 and the second gate structure 214 are electrically connected to each other by the third doped region 218. It is well-known to those skilled in the art that the first gate structure 212 and the second gate structure 214 respectively include agate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 200 further includes a source region 220S and a drain region 220D formed in the substrate/the well region 202 respectively at two sides of the gate set 210. As shown in FIG. 2A and FIG. 2B, the first gate structure 212 is positioned in between the third doped region 218 and the drain region 220D while the second gate structure 214 is positioned in between the third doped region 218 and the source region 220S. The source region 220S, the drain region 220D and the third doped region 218 include a first conductivity type while the well region 202 includes a second conductivity type, and the first conductivity type and the second conductivity type are complementary to each other. For example, the first conductivity type is an n type and the second conductivity type is a p type in the preferred embodiment. However, as mentioned above, the first conductivity type can be the p type and the second conductivity type can be the n type. Furthermore, the ESD protection semiconductor device 200 includes an isolation structure 204 and a guard ring 206 including the second conductivity type. The isolation structure 204 and the guard ring 206 surround the ESD protection semiconductor device 200 and electrically isolate the ESD protection semiconductor device 200 from other device. In the preferred embodiment, the isolation structure 204 preferably includes a STI structure, but not limited to this.

Please still refer to FIG. 2A and FIG. 2B. The ESD protection semiconductor device 200 provided by the preferred embodiment further includes at least a first doped region 230 formed in the drain region 220D and at least a second doped region 232 formed in the substrate, particularly in the source region 220S. As shown in FIG. 2A, the first doped region 230 is positioned in a center of the drain region 220D and the second doped region 232 is also positioned in a center of the source region 220S, but not limited to this. The modifications to the arrangement of the first doped region 230 and the drain region 220D and to the arrangement of the second doped region 232 and the source region 220S are exemplarily shown in FIGS. 3-5 and will be detailed thereafter. It is noteworthy that though the first doped region 230 is formed in the drain region 220D, the first doped region 230 is spaced apart from the drain region 220D by a first blocking structure 240. In the same concept, though the second doped region 232 is formed in the source region 220S, the second doped region 232 is spaced apart from the source region 220S by a second blocking structure 242. As shown in FIG. 2A and FIG. 2B, the first blocking structure 240 surrounds the first doped region 230 and therefore isolates the first doped region 230 from the drain region 220D. Also, the second blocking structure 242 surrounds the second doped region 232 and therefore isolates the second doped region 232 from the source region 220S. In the preferred embodiment, the first blocking structure 240 and the second blocking structure 242 include STI structure. However, the first blocking structure 240 and the second blocking structure 242 can include dummy gate structure or SAB structure. Furthermore, both of the first doped region 230 and the second doped region 232 include the second conductivity type.

More important, the first doped region 230 formed in the drain region 220D and the second doped region 232 formed in the source region 220S are electrically connected to each other as shown in FIG. 2B. Furthermore, in the gate set 210, the first gate structure 212 is electrically connected to a power supply pad (Vdd pad) VDD while the second gate structure 214 is electrically connected to a ground pad GND or a signal input pad IN. The source region 220S and the guard ring 206 are electrically connected to a ground pad GND, and the drain region 220D is electrically connected to an input/output pad I/O. As shown in FIG. 2B and FIG. 2C, when an ESD event occurs, the ESD surges will be diverted to the ground by the second gate structure 214, which is electrically connected to the ground pad GND. More important, the n-drain region 220D, the p-well region 202 and the p-typed first doped region 230 construct a diode, and this diode is self-triggered during the ESD event. Consequently, the ESD current is bypassed from the drain region 220D to the first doped region 230 and to the second doped region 232 as arrows "a" depicted. Moreover, the n-drain region 220D, the p-well region 202 and the n-source region 220S construct an npn-BJT. This npn-BJT is also self-triggered during the ESD events, and thus the ESD current is bypassed from the drain region 220D to the source region 220S, which is electrically connected to the ground pad GND, as arrow "b" depicted. Briefly speaking, the preferred embodiment provides the self-triggered structures (including the diode and the BJT) for bypassing the ESD currents.

Accordingly, the ESD protection semiconductor device 200 provided by the preferred embodiment is a cascade transistor device including a self-triggered structure, and the self-triggered structure is a diode constructed by the first doped region 230 formed in the drain region 220D and the second doped region 232 formed in the drain region 220D.

As mentioned above, the first doped region 230 is electrically connected to the second doped region 232. Consequently, the ESD currents can be bypassed by the self-triggered diode. Therefore, the threshold voltage of the ESD protection semiconductor device 200 is efficaciously reduced and thus the turn-on speed is improved. Since the self-triggered diode serves as the bypass for ESD, damage caused by ESD event is avoided and thus device robustness of the ESD protection semiconductor device 200 is improved. Accordingly, the ESD pulse voltage of the ESD protection semiconductor device 200 in human body mode (HBM) is increased from 1.4 kV to 2.4 kV. That is, tolerance of the ESD protection semiconductor device 200 is improved at least 71%. More important, since the bypass is a self-triggered structure, no leakage is found when the ESD protection semiconductor device 200 is turned off. Additionally, according to the preferred embodiment, formation of the first doped region 230 and the second doped region 232 can be integrated in the state-of-the-art semiconductor manufacturing process without increasing process complexity and cost.

Figure 3:
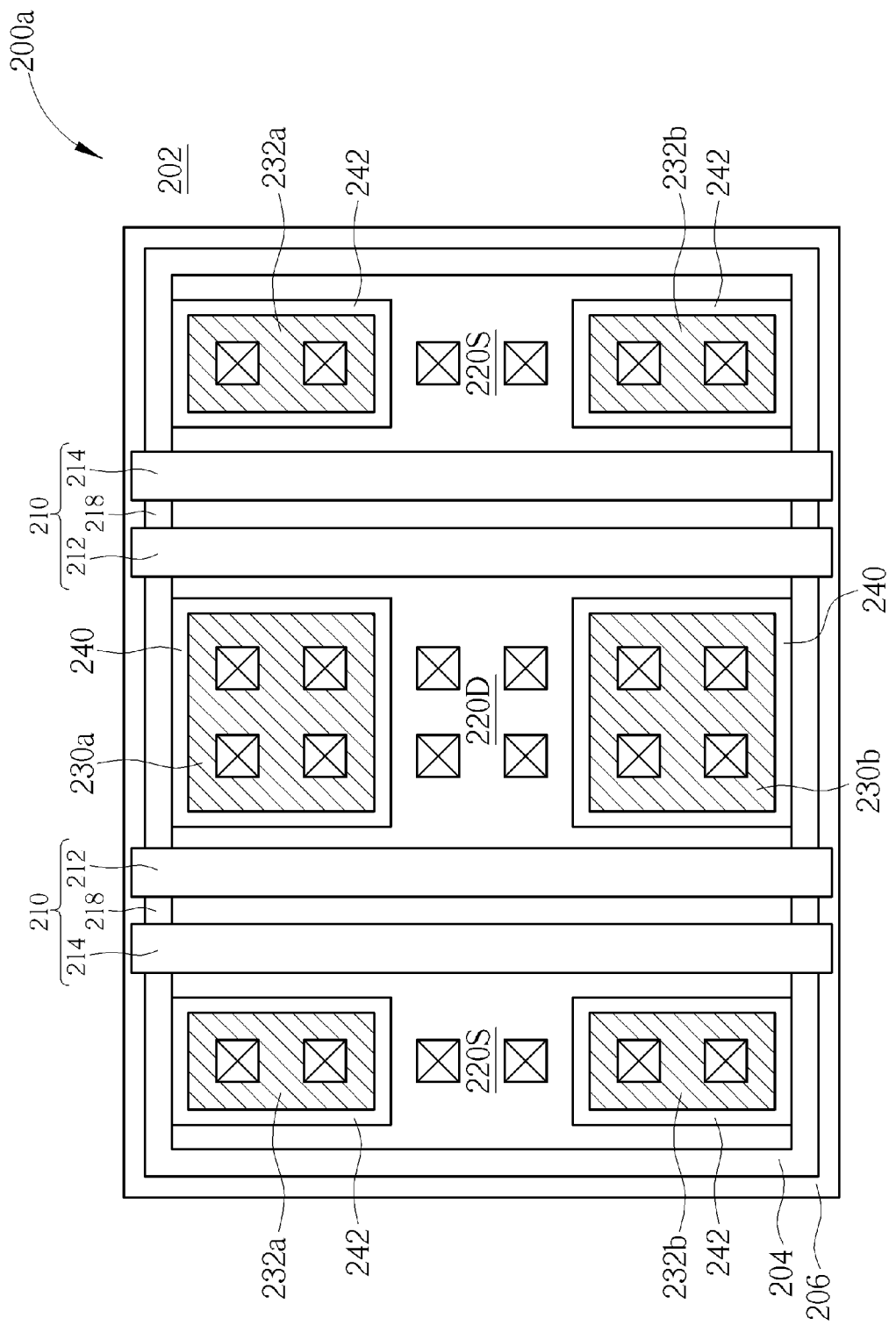
FIG. 3 is a schematic drawing illustrating a layout structure of the ESD protection semiconductor device provided by a modification of the present invention.

Please refer to FIG. 3, which is a schematic drawing illustrating a layout structure of the ESD protection semiconductor device provided by a modification of the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. As shown in FIG. 3, the difference between the modification and the preferred embodiments is detailed. In the aforementioned ESD protection semiconductor device, the first doped region is formed in the center of the drain region and the second doped region is formed in the center of the source region. However, in the ESD protection semiconductor device 200a provided by the modification, the first doped region 230 further includes a pair of sub-first doped regions 230a/230b. The sub-first doped regions 230a/230b are positioned at two opposite ends of the drain region 220D, respectively, as shown in FIG. 3. In the same concept, the second doped region 232 further includes a pair of sub-second doped regions 232a/232b, and the sub-second doped regions 232a/232b are positioned at two opposite ends of the source region 220S, respectively, as shown in FIG. 3.

In the present modification, an amount of the first doped region 232a/232b, which are used to construct the self-triggered structure, is increased. Consequently, an amount of the self-triggered structure is increased and thus more bypasses are obtained. Therefore the ESD protection semiconductor device 200a is further improved.

Figure 4:
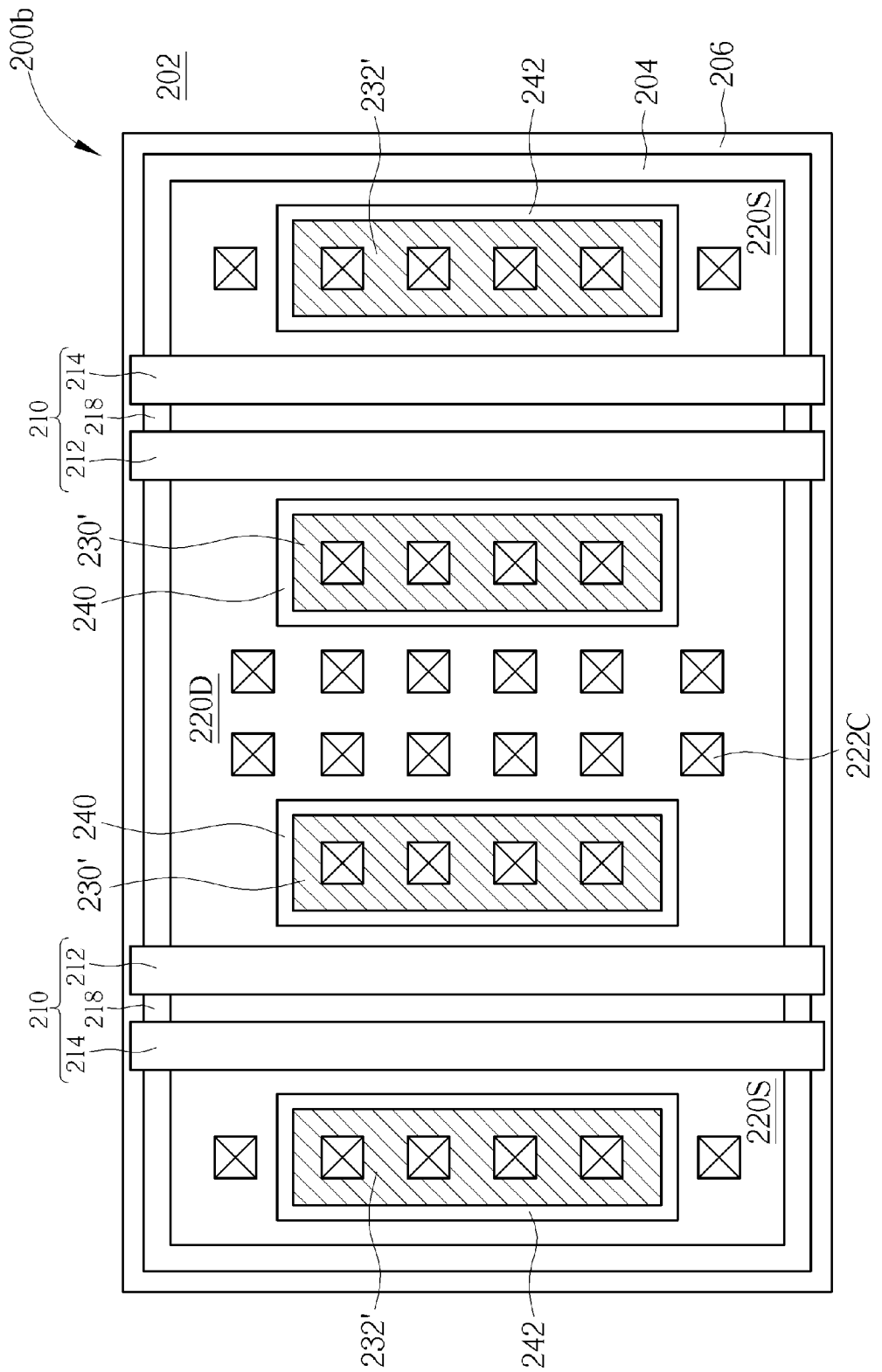
FIG. 4 is a schematic drawing illustrating a layout structure of the ESD protection semiconductor device provided by another modification of the present invention.

Please refer to FIG. 4, which is a schematic drawing illustrating a layout structure of the ESD protection semiconductor device provided by another modification of the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. As shown in FIG. 4, the difference between the present modification and the abovementioned preferred embodiments/modification is detailed. In the ESD protection semiconductor device provided by the embodiments, the first doped region includes an islanding pattern and is formed in the center of the drain region, and the second doped region also includes an islanding pattern and is formed in the center of the source region. Different from the aforementioned embodiments, the first doped region 230' of the ESD protection semiconductor device 200b provided by the present modification includes a stripe pattern and is positioned in between drain contact plugs 222C and the gate set 210. The second doped region 232' includes a stripe pattern and is positioned in the center of the source region 220S.

In the present modification, an amount of the first doped region 230', which are used to construct the self-triggered structure, is increased. Consequently, an amount of the self-triggered structure is increased and thus more bypasses are obtained. Therefore the ESD protection semiconductor device 200b is further improved. Additionally, since the first doped region 230' including the stripe pattern is positioned in between the drain contact plugs 222C and the gate set 210, and, as shown in FIG. 4, there is no drain contact plugs 222C disposed on the opposite ends of the first doped region 230', avoidance of the contact plugs is no longer an issue in wiring design. Accordingly, product and process design are both simplified.

Please refer to FIG. 5, which is a schematic drawing illustrating a layout structure of the ESD protection semiconductor device provided by a still another modification of the present invention. It should be noted that elements the same in the present modification and the second preferred embodiment are designated by the same numerals and include the same material choice and electrical relationships, therefore those details are omitted for simplicity. More important, the present modification is provided not only for the second preferred embodiment, but also for the first preferred embodiment and the following provided preferred embodiments. As shown in FIG. 5, the difference between the modification and the preferred embodiment is: In the ESD protection semiconductor device 200c provided by the modification, the first doped region 230 further includes a pair of sub-first doped regions 230a'/230b'. The sub-first doped regions 230a'/230b' are positioned at two opposite ends of the drain region 220D, respectively, as shown in FIG. 5. More important, the sub-first doped regions 230a'/230b' respectively include a stripe pattern and are positioned in between the drain contact plugs 222C and the gate set 210. In the same concept, the second doped region 232 further includes a pair of sub-second doped regions 232a'/232b' having the stripe pattern, and the sub-second doped regions 232a'/232b' are positioned at two opposite ends of the source region 220S, respectively, as shown in FIG. 5.

In the present modification, an amount of the first doped region 232a'/232b' is increased. Consequently, an amount of the self-triggered structure is increased and thus more bypasses are obtained. Therefore the ESD protection semiconductor device 200c is further improved. Additionally, since the first doped region 232a'/232b' including the stripe pattern is positioned in between the drain contact plugs 222C and the gate set 210, and, as shown in FIG. 5, there is no drain contact plugs 222C disposed on the opposite ends of the first doped region 232a'/232b', avoidance of the contact plugs is no longer an issue in wiring design. Accordingly, product and process design are both simplified.

Figure 6A:
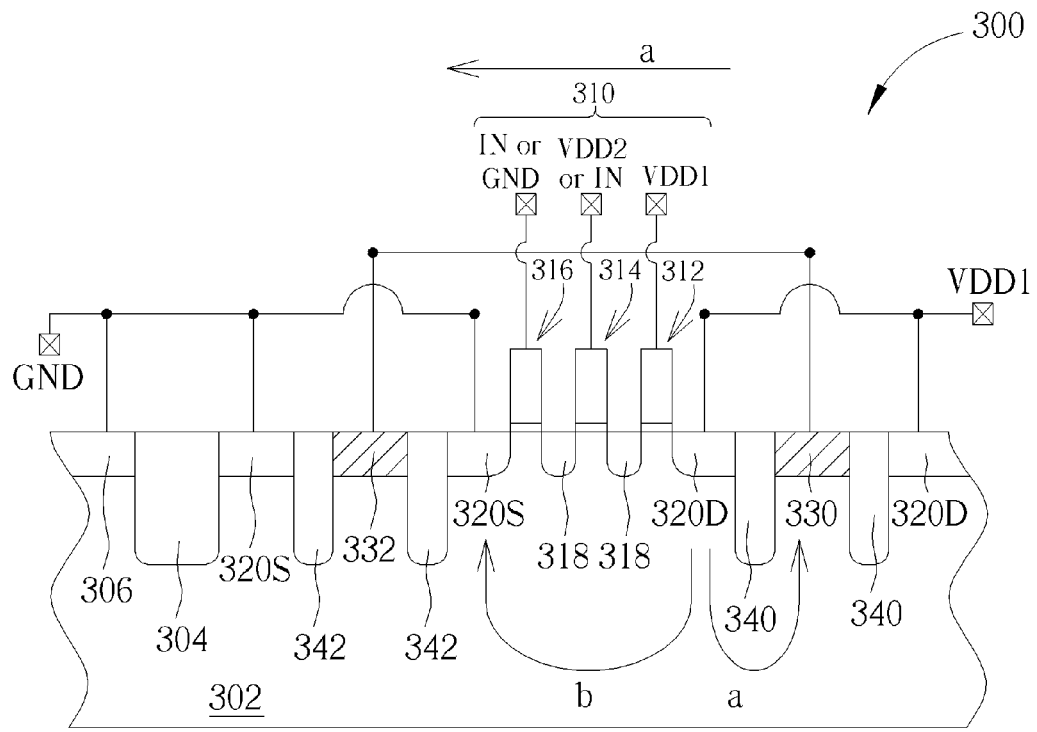
FIG. 6A is a schematic cross-sectional view illustrating an ESD protection semiconductor device provided by a third preferred embodiment of the present invention.
Figure 6B:
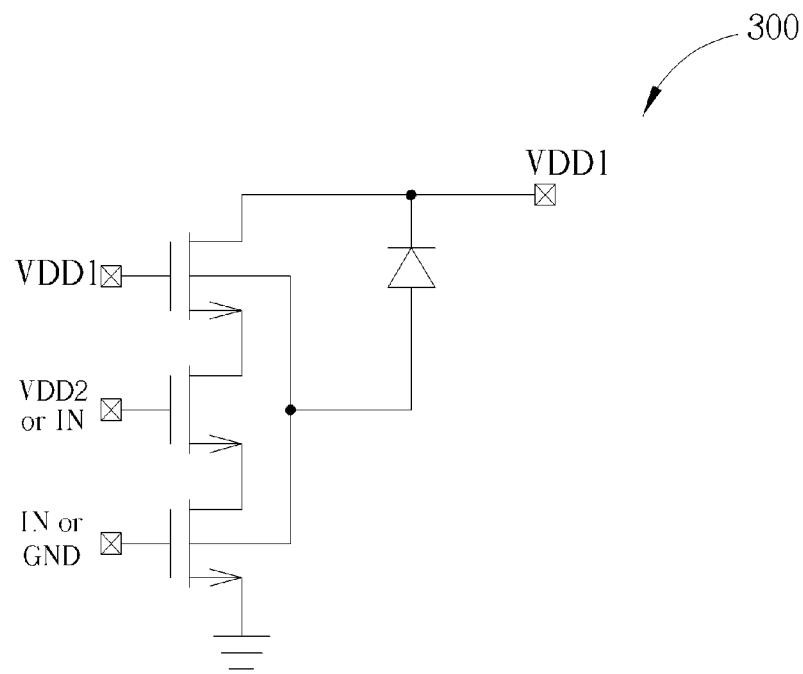
FIG. 6B is a circuit diagram of the ESD protection semiconductor device provided by the third preferred embodiment.

Please refer to FIGS. 6A-6B, wherein FIG. 6A is a schematic cross-sectional view illustrating an ESD protection semiconductor device provided by a third preferred embodiment of the present invention, and FIG. 6B is a circuit diagram of the ESD protection semiconductor device provided by the third preferred embodiment. As shown in FIG. 6A, the ESD protection semiconductor device 300 provided by the preferred embodiment includes a substrate, and the substrate includes a well region 302. A gate set 310 is positioned on the substrate and the well region 302. In the preferred embodiment, the gate set 310 includes a first gate structure 312, a second gate structure 314, a third doped region 316, and two third doped regions 318. As shown in FIG. 6A, the third doped regions 318 are respectively positioned in between the first gate structure 312 and the second gate structure 314, and in between the second gate structure 314 and the third gate structure 316. Therefore the first gate structure 312, the second gate structure 314 and the third gate structure 316 are all spaced apart from each other by the third doped regions 318. However, the first gate structure 312, the second gate structure 314 and the third gate structure 316 are all electrically connected to each other by the third doped regions 318. It is well-known to those skilled in the art that the first gate structure 312, the second gate structure 314 and the third gate structure 318 respectively include a gate conductive layer and a gate dielectric layer, and since materials for the gate conductive layer and the gate dielectric layer are well-known to those skilled in the art, those details are omitted in the interest of brevity. According to the preferred embodiment, the ESD protection semiconductor device 300 further includes a source region 320S and a drain region 320D formed in the substrate/the well region 302 respectively at two sides of the gate set 310. As shown in FIG. 6A, the first gate structure 312, the second gate structure 314 and the third gate structure 316 on the substrate/the well region 302 are arranged in a direction from the drain region 320D to the source region 320S. The source region 320S, the drain region 320D and the third doped regions 318 include a first conductivity type while the well region 302 includes a second conductivity type, and the first conductivity type and the second conductivity type are complementary to each other. For example, the first conductivity type is an n type and the second conductivity type is a p type in the preferred embodiment. However, as mentioned above, the first conductivity type can be the p type and the second conductivity type can be the n type. Furthermore, the ESD protection semiconductor device 300 includes an isolation structure 304 and a guard ring 306 including the second conductivity type. The isolation structure 304 and the guard ring 306 surround the ESD protection semiconductor device 300 and electrically isolate the ESD protection semiconductor device 300 from other device. In the preferred embodiment, the isolation structure 304 preferably includes a STI structure, but not limited to this.

Please still refer to FIG. 6A. The ESD protection semiconductor device 300 provided by the preferred embodiment further includes at least a first doped region 330 formed in the drain region 320D and at least a second doped region 332 formed in the substrate, particularly in the source region 320S. As shown in FIG. 6A, the first doped region 330 is positioned in a center of the drain region 320D and the second doped region 332 is also positioned in a center of the source region 320S, but not limited to this. The modifications to the arrangement of the first doped region 330 and the drain region 320D and to the arrangement of the second doped region 332 and the source region 320S are exemplarily shown in FIGS. 3-5 as and have been described in the aforementioned modifications therefore those details are omitted for simplicity. It is noteworthy that though the first doped region 330 is formed in the drain region 320D, the first doped region 330 is spaced apart from the drain region 320D by a first blocking structure 340. In the same concept, though the second doped region 332 is formed in the source region 320S, the second doped region 332 is spaced apart from the source region 320S by a second blocking structure 342. As shown in FIG. 6A, the first blocking structure 340 surrounds the first doped region 330 and therefore isolates the first doped region 330 from the drain region 320D. Also, the second blocking structure 342 surrounds the second doped region 332 and therefore isolates the second doped region 332 from the source region 320S. In the preferred embodiment, the first blocking structure 340 and the second blocking structure 342 include STI structure. However, the first blocking structure 340 and the second blocking structure 342 can include dummy gate structure or SAB structure. Furthermore, both of the first doped region 330 and the second doped region 332 include the second conductivity type.

More important, the first doped region 330 formed in the drain region 320D and the second doped region 332 formed in the source region 320S are electrically connected to each other as shown in FIG. 6A. Furthermore, the drain region 320D and the first gate structure 312 of the gate set 310 are electrically connected to a power supply pad VDD1, the second gate structure 314 of the gate set 310 is electrically connected to another power supply pad VDD2 or a signal input pad IN, and the third gate structure 316 of the gate set 310 is electrically connected to a signal input pad IN or a ground pad GND. And the source region 320S and the guard ring 306 are electrically connected to a ground pad GND. As shown in FIG. 6A and FIG. 6B, when an ESD event occurs, the n-drain region 320D, the p-well region 302 and the p-typed first doped region 330 construct a diode, and this diode is self-triggered during the ESD event. Consequently, the ESD current is bypassed from the drain region 320D to the first doped region 330 and to the second doped region 332 as arrow "a" depicted. Moreover, the n-drain region 320D, the p-well region 302 and the n-source region 320S construct an npn-BJT. This npn-BJT is also self-triggered during the ESD events, and thus the ESD current is bypassed from the drain region 320D to the source region 320S, which is electrically connected to the ground pad GND, as arrow "b" depicted. Briefly speaking, the preferred embodiment provides the self-triggered structures (including the diode and the BJT) for bypassing the ESD currents. However, it should be easily realized by those skilled in the art that the electrical relationship between the gate structures, the power supply pads, the signal input pads and the ground pads can be modified according to different requirements and thus it is not limited to this.

Accordingly, the ESD protection semiconductor device 300 provided by the preferred embodiment is a multi-gate transistor device including a self-triggered structure, and the amount of the gate structures can be adjusted according to different voltage requirements. The self-triggered structure is a diode constructed by the first doped region 330 formed in the drain region 320D and the second doped region 332 formed in the drain region 320D. And the first doped region 330 is electrically connected to the second doped region 332. Consequently, the ESD currents can be bypassed by the self-triggered diode. Since the self-triggered diode serves as the bypass for ESD, damage caused by ESD event is avoided and thus device robustness of the ESD protection semiconductor device 300 is improved. More important, since the bypass is a self-triggered structure, no leakage is found when the ESD protection semiconductor device 300 is turned off. Additionally, according to the preferred embodiment, formation of the first doped region 330 and the second doped region 332 can be integrated in the state-of-the-art semiconductor manufacturing process without increasing process complexity and cost.

Figure 7:
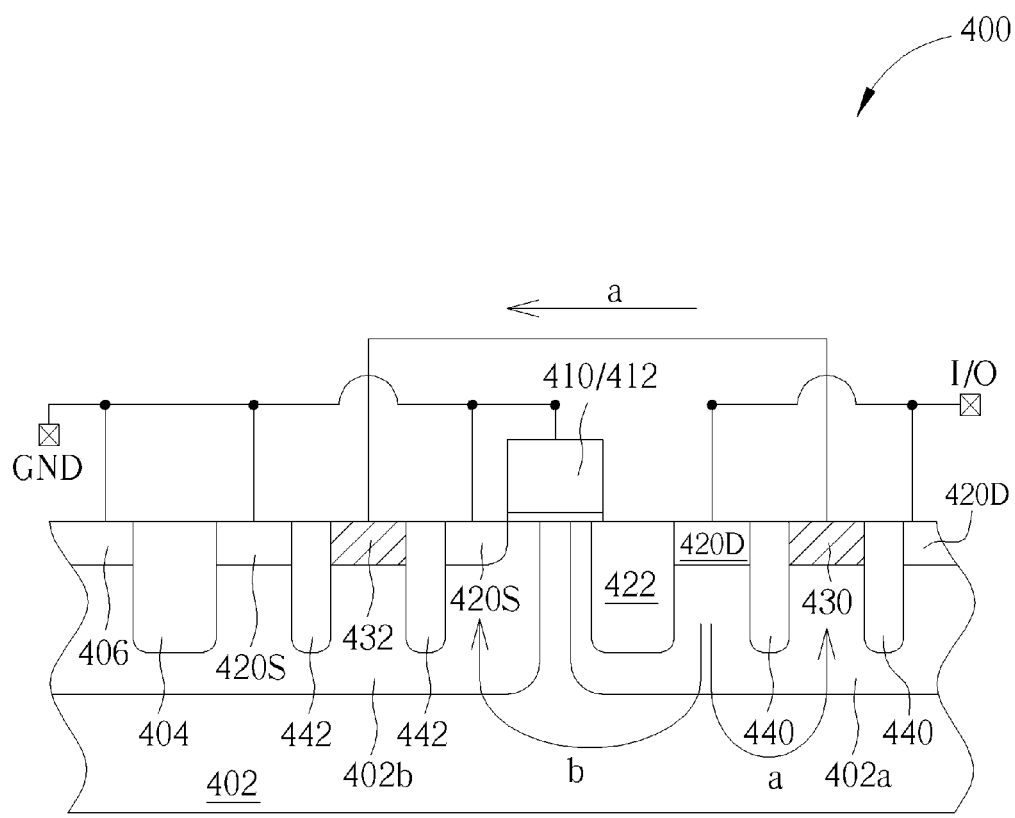
FIG. 7 is a schematic cross-sectional view illustrating an ESD protection semiconductor device provided by a fourth preferred embodiment of the present invention.

Please refer to FIG. 7, which is a schematic cross-sectional view illustrating an ESD protection semiconductor device provided by a fourth preferred embodiment of the present invention. As shown in FIG. 7, the ESD protection semiconductor device 400 provided by the preferred embodiment includes a substrate 402, and the substrate 402 includes a first well region 402a and a second well region 402b. The first well region 402a and the second well region 402b are spaced apart from each other by the substrate 402. The first well region 402a includes a first conductivity type, and the substrate 402 and the second well region 402b includes a second conductivity type. And the first conductivity type and the second conductivity type are complementary to each other. In the preferred embodiment, the first conductivity type is an n type and the second conductivity type is a p type, but not limited to this. However, as mentioned above, it should be easily realized to those skilled in the art that the first conductivity type can be the p type and the second conductivity type can be the n type. A gate set 410 is positioned on the substrate 402. In the preferred embodiment, the gate set 410 includes a single gate structure 412. As shown in FIG. 7, the single gate structure 412 is positioned in between the first well region 402a and the second well region 402b. Furthermore, the single gate structure 412 overlaps a portion of the first well region 402a and a portion of the second gate structure 402b, respectively. It is well-known to those skilled in the art that the single gate structure 412 includes a gate conductive layer and a gate dielectric layer, and since materials for the gate conductive layer and the gate dielectric layer are well-known to those skilled in the art, those details are omitted in the interest of brevity. Additionally, the ESD protection semiconductor device 400 further include an isolation structure 422 formed in the first well region 402a, and the gate set 410 (that is the single gate structure 412) covers at least a portion of the isolation structure 422. According to the preferred embodiment, the ESD protection semiconductor device 400 further includes a source region 420S and a drain region 420D formed in the substrate 402 respectively at two sides of the gate set 410. Particularly, the drain region 420D is positioned in the first well region 402a and the source region 420S is positioned in the second well region 402b. The source region 420S and the drain region 420D include a first conductivity type. Furthermore, the ESD protection semiconductor device 400 includes an isolation structure 404 and a guard ring 406 including the second conductivity type. The isolation structure 404 and the guard ring 406 surround the ESD protection semiconductor device 400 and electrically isolate the ESD protection semiconductor device 400 from other device. In the preferred embodiment, the isolation structure 404 preferably includes a STI structure, but not limited to this.

Please still refer to FIG. 7. The ESD protection semiconductor device 400 provided by the preferred embodiment further includes at least a first doped region 430 formed in the drain region 420D and at least a second doped region 432 formed in the substrate, particularly in the source region 420S. Since the drain region 420D is formed in the first well region 402a and the source region 420S is formed in the second well region 402b, it is taken that the first doped region 430 is also formed in the first well region 402a and the second doped region 432 is also formed in the second well region 402b. As shown in FIG. 7, the first doped region 430 is positioned in a center of the drain region 420D and the second doped region 432 is also positioned in a center of the source region 420S, but not limited to this. The modifications to the arrangement of the first doped region 430 and the drain region 420D and to the arrangement of the second doped region 432 and the source region 420S are exemplarily shown in FIGS. 3-5 as and have been described in the aforementioned modifications therefore those details are omitted for simplicity. It is noteworthy that though the first doped region 430 is formed in the drain region 420D, the first doped region 430 is spaced apart from the drain region 420D by a first blocking structure 440. In the same concept, though the second doped region 432 is formed in the source region 420S, the second doped region 432 is spaced apart from the source region 420S by a second blocking structure 442. As shown in FIG. 7, the first blocking structure 440 surrounds the first doped region 430 and therefore isolates the first doped region 430 from the drain region 420D. Also, the second blocking structure 442 surrounds the second doped region 432 and therefore isolates the second doped region 432 from the source region 420S. In the preferred embodiment, the first blocking structure 440 and the second blocking structure 442 include STI structure. However, the first blocking structure 440 and the second blocking structure 442 can include dummy gate structure or SAB structure. Furthermore, both of the first doped region 430 and the second doped region 432 include the second conductivity type.

More important, the first doped region 430 formed in the drain region 420D and the second doped region 432 formed in the source region 420S are electrically connected to each other as shown in FIG. 7. Furthermore, the gate set 410 (that is the single gate structure 412), the source region 420S and the guard ring 406 are electrically connected to a ground pad GND, and the drain region 420D is electrically connected to an input/output pad I/O. As shown in FIG. 7, when an ESD event occurs, the ESD surges will be diverted to the ground by the gate set 410 (that is the single gate structure 412) which is electrically connected to the ground pad GND. More important, the n-drain region 420D, the n-typed first well region 402a and the p-typed first doped region 430 construct a diode and this diode is self-triggered during the ESD event. Consequently, the ESD current is bypassed from the drain region 420D to the first doped region 430 and to the second doped region 432 as arrow "a" depicted. Moreover, the n-drain region 420D, the n-typed first well region 402a, the p-substrate 402, the p-typed second well region 402b, and the n-source region 420S construct an npn-BJT. This npn-BJT is also self-triggered during the ESD events, and thus the ESD current is bypassed from the drain region 420D to the source region 420S, which is electrically connected to the ground pad GND, as arrow "b" depicted. Briefly speaking, the preferred embodiment provides the self-triggered structures (including the diode and the BJT) for bypassing the ESD currents.

Accordingly, the ESD protection semiconductor device 400 provided by the preferred embodiment is a LDMOS transistor including a self-triggered structure. And the self-triggered structure is a diode constructed by the first doped region 430 formed in the drain region 420D and the second doped region 432 formed in the drain region 420D. As mentioned above, the first doped region 430 is electrically connected to the second doped region 432. Consequently, the ESD currents can be bypassed by the self-triggered diode. Therefore, the threshold voltage of the ESD protection semiconductor device 400 is efficaciously reduced and thus the turn-on speed is improved. Since the self-triggered diode serves as the bypass for ESD, damage caused by ESD event is avoided and thus device robustness of the ESD protection semiconductor device 400 is improved. More important, since the bypass is a self-triggered structure, no leakage is found when the ESD protection semiconductor device 400 is turned off. Additionally, according to the preferred embodiment, formation of the first doped region 430 and the second doped region 432 can be integrated in the state-of-the-art semiconductor manufacturing process without increasing process complexity and cost.

Figure 8A:
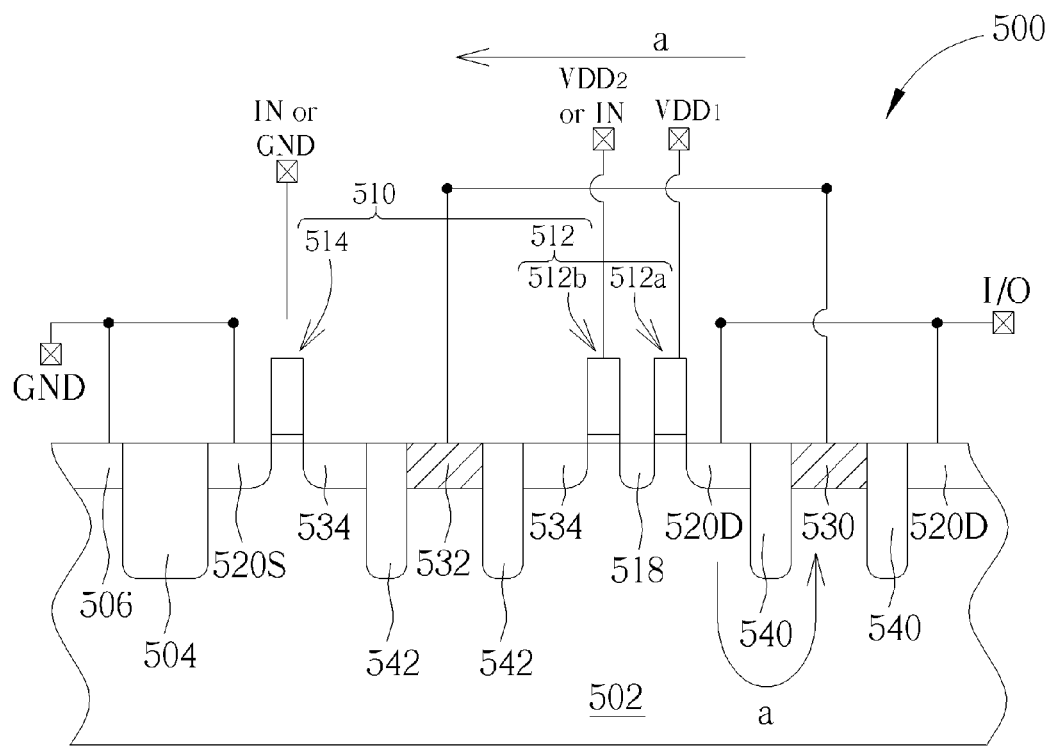
FIG. 8A is a schematic cross-sectional view illustrating an ESD protection semiconductor device provided by a fifth preferred embodiment of the present invention.
Figure 8B:
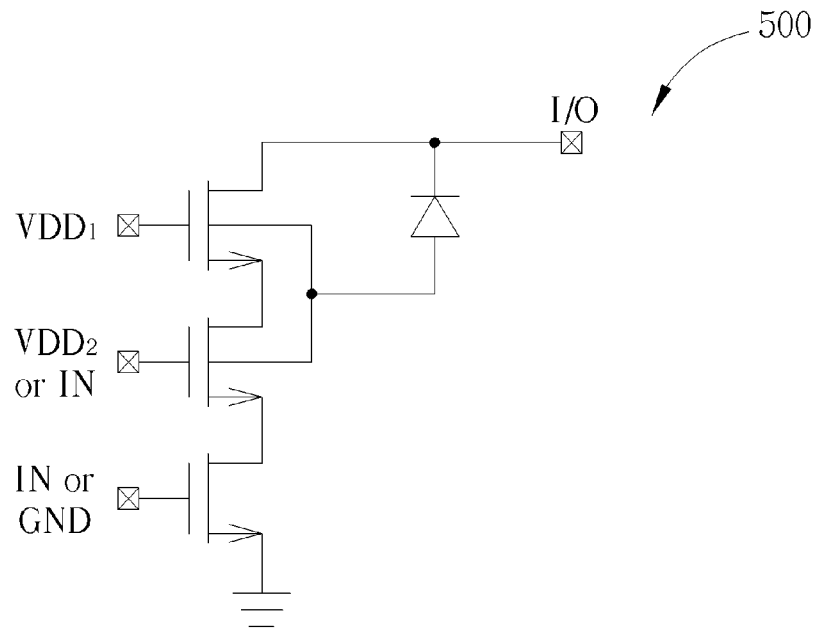
FIG. 8B is a circuit diagram of the ESD protection semiconductor device provided by the fifth preferred embodiment.

Please refer to FIGS. 8A-8B, wherein FIG. 8A is a schematic cross-sectional view illustrating an ESD protection semiconductor device provided by a fifth preferred embodiment of the present invention, and FIG. 8B is a circuit diagram of the ESD protection semiconductor device provided by the fifth preferred embodiment. As shown in FIG. 8A, the ESD protection semiconductor device 500 provided by the preferred embodiment includes a substrate, and the substrate includes a well region 502. A gate set 510 is positioned on the substrate and the well region 502. In the preferred embodiment, the ESD protection semiconductor device 500 further includes a source region 520S and a drain region 520D formed in the substrate/the well region 502 respectively at two sides of the gate set 510. At least a first doped region 530 is formed in the drain region 520D. The source region 520S and the drain region 520D include a first conductivity type while the substrate/the well region 502 and the first doped region 530 include a second conductivity type. The first conductivity type and the second conductivity type are complementary to each other. For example, the first conductivity type is an n type and the second conductivity type is a p type in the preferred embodiment, but not limited to this. In the preferred embodiment, the gate set 510 further includes a first gate group 512 and a second gate group 514. As shown in FIG. 8A, the first gate group 512 and the second gate group 514 are spaced apart from each other by a fourth doped region 534 and a second doped region 532 formed in the fourth doped region 534. In other words, the first gate group 512 is positioned in between the drain region 520D and the fourth doped region 534, and the second gate group 514 is positioned in between the fourth doped region 534 and the source region 520S. The second doped region 532 includes the second conductivity type and the fourth doped region 534 includes the first conductivity type. In the preferred embodiment, the first gate group 512 further includes at least a first gate structure 512a and a second gate structure 512b while the second gate group 514 includes a single gate structure 514. A third doped region 518 including the first conductivity type is formed in between the first gate structure 512a and the second gate structure 512b of the first gate group 512 so that the first gate structure 512a and the second gate structure 512b are spaced apart from each other by the third doped region 518. However, the first gate structure 512a and the second gate structure 512b are electrically connected to each other by the third doped region 518. Particularly speaking, the first gate structure 512a is positioned in between the third doped region 518 and the drain region 520D while the second gate structure 512b is positioned in between the third doped region 518 and the fourth doped region 534. It is well-known to those skilled in the art that the first gate structure 512a, the second gate structure 512b, and the single gate structure 514 respectively include a gate conductive layer and a gate dielectric layer, and since materials for the gate conductive layer and the gate dielectric layer are well-known to those skilled in the art, those details are omitted in the interest of brevity. Furthermore, the ESD protection semiconductor device 500 includes an isolation structure 504 and a guard ring 506 including the second conductivity type. The isolation structure 504 and the guard ring 506 surround the ESD protection semiconductor device 500 and electrically isolate the ESD protection semiconductor device 500 from other device. In the preferred embodiment, the isolation structure 504 preferably includes a STI structure, but not limited to this.

Please still refer to FIG. 8A. In the ESD protection semiconductor device 500 provided by the preferred embodiment, the first doped region 530 is positioned in a center of the drain region 520D and the second doped region 532 is also positioned in a center of the source region 520S, but not limited to this. The modifications to the arrangement of the first doped region 530 and the drain region 520D and to the arrangement of the second doped region 532 and the source region 520S are exemplarily shown in FIGS. 3-5 and have been described in the aforementioned modifications therefore those details are omitted for simplicity. It is noteworthy that though the first doped region 530 is formed in the drain region 520D, the first doped region 530 is spaced apart from the drain region 520D by a first blocking structure 540. In the same concept, though the second doped region 532 is formed in the source region 520S, the second doped region 532 is spaced apart from the source region 520S by a second blocking structure 542. As shown in FIG. 8A, the first blocking structure 540 surrounds the first doped region 530 and therefore isolates the first doped region 530 from the drain region 520D. Also, the second blocking structure 542 surrounds the second doped region 532 and therefore isolates the second doped region 532 from the source region 520S. In the preferred embodiment, the first blocking structure 540 and the second blocking structure 542 include STI structure. However, the first blocking structure 540 and the second blocking structure 542 can include dummy gate structure or SAB structure.

More important, the first doped region 530 formed in the drain region 520D and the second doped region 532 formed in the source region 520S are electrically connected to each other as shown in FIG. 8A. Furthermore, the first gate structure 512a of the first gate group 512 is electrically connected to a first power supply pad VDD1, the second gate structure 512b of the first gate group 512 is electrically connected to a second power supply pad VDD2 or a signal input pad IN, and the second gate group 514 (that is the single gate structure 514) is electrically connected to a signal input pad IN or a ground pad GND. The source region 520S and the guard ring 506 are electrically connected to a ground pad GND, and the drain region 520D is electrically connected to an input/output pad I/O. As shown in FIG. 8A and FIG. 8B, when an ESD event occurs, the n-drain region 520D, the p-well region 502 and the p-typed first doped region 530 construct a diode, and this diode is self-triggered during the ESD event. Consequently, the ESD current is bypassed from the drain region 520D to the first doped region 530 and to the second doped region 532 as arrow "a" depicted. In other words, the preferred embodiment provides a self-triggered structure (including the diode) for bypassing the ESD currents. However, it should be easily realized to those skilled in the art that the electrical relationship between the gate structures, the power supply pads, the signal input pads and the ground pads can be modified according to different requirements and thus it is not limited to this.

Accordingly, the ESD protection semiconductor device 500 provided by the preferred embodiment is a multi-gate transistor including a self-triggered structure, and the gate structures can be grouped according to different product requirements. The self-triggered structure is a diode constructed by the first doped region 530 formed in the drain region 520D and the second doped region 532 formed in the drain region 520D. And the first doped region 530 is electrically connected to the second doped region 532. Consequently, the ESD currents can be bypassed by the self-triggered diode. Since the self-triggered diode serves as the bypass for ESD, damage caused by ESD event is avoided and thus device robustness of the ESD protection semiconductor device 500 is improved. More important, since the bypass is a self-triggered structure, no leakage is found when the ESD protection semiconductor device 500 is turned off. Additionally, according to the preferred embodiment, formation of the first doped region 530 and the second doped region 532 can be integrated in the state-of-the-art semiconductor manufacturing process without increasing process complexity and cost.

Figure 9A:
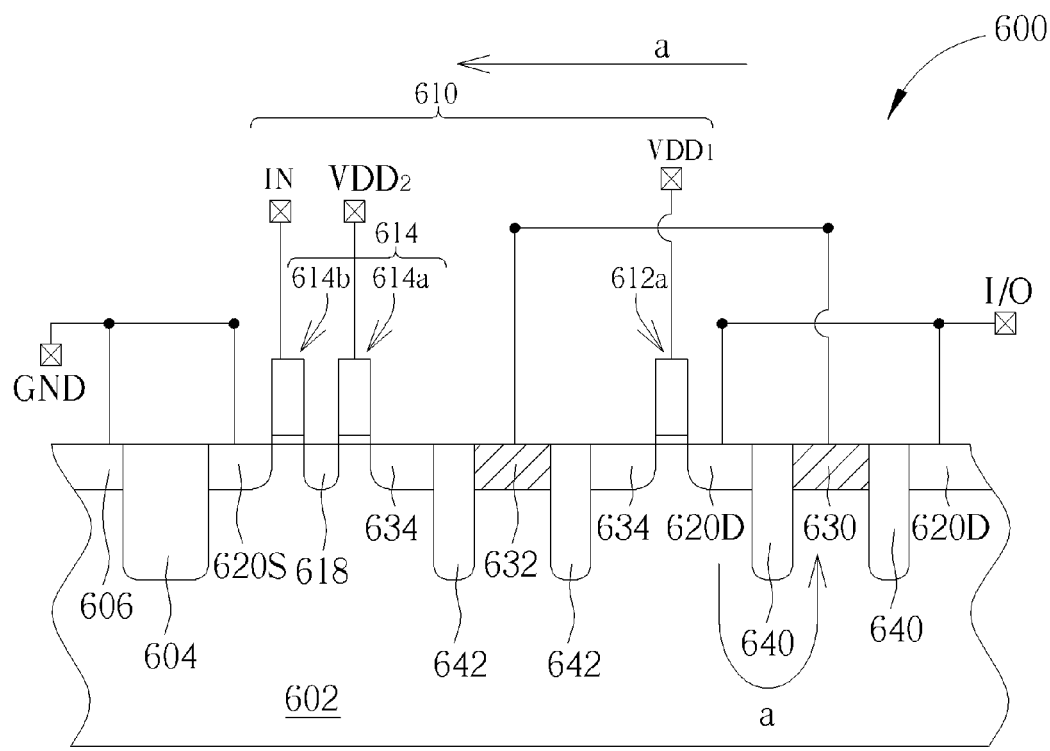
FIG. 9A is a schematic cross-sectional view illustrating an ESD protection semiconductor device provided by a sixth preferred embodiment of the present invention.
Figure 9B:
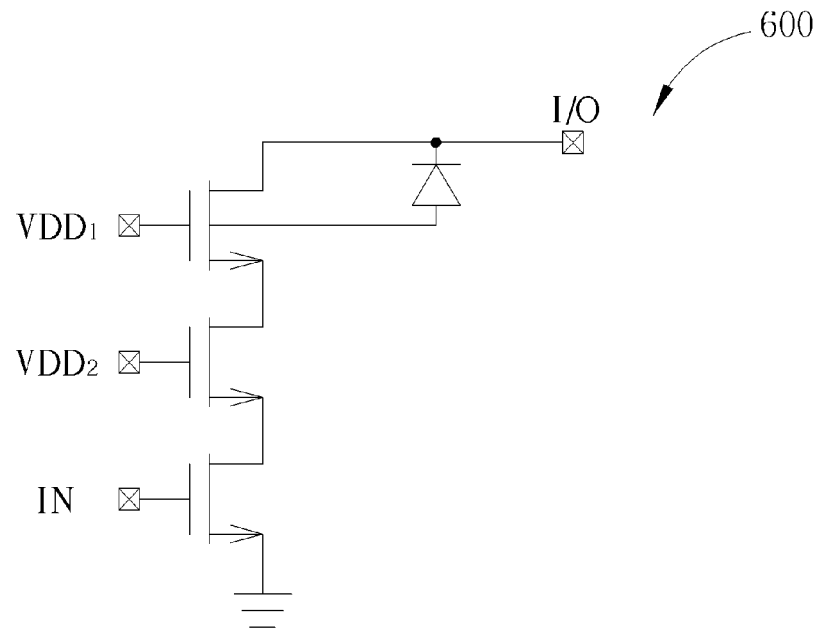
FIG. 9B is a circuit diagram of the ESD protection semiconductor device provided by the sixth preferred embodiment.

Please refer to FIGS. 9A-9B, wherein FIG. 9A is a schematic cross-sectional view illustrating an ESD protection semiconductor device provided by a sixth preferred embodiment of the present invention, and FIG. 9B is a circuit diagram of the ESD protection semiconductor device provided by the sixth preferred embodiment. As shown in FIG. 9A, the ESD protection semiconductor device 600 provided by the preferred embodiment includes a substrate, and the substrate includes a well region 602. A gate set 610 is positioned on the substrate and the well region 602. In the preferred embodiment, the ESD protection semiconductor device 600 further includes a source region 620S and a drain region 620D formed in the substrate/the well region 602 respectively at two sides of the gate set 610. At least a first doped region 630 is formed in the drain region 620D. The source region 620S and the drain region 620D include a first conductivity type while the substrate/the well region 602 and the first doped region 630 include a second conductivity type. The first conductivity type and the second conductivity type are complementary to each other. For example, the first conductivity type is an n type and the second conductivity type is a p type in the preferred embodiment, but not limited to this. In the preferred embodiment, the gate set 610 further includes a first gate group 612 and a second gate group 614. As shown in FIG. 9A, the first gate group 612 and the second gate group 614 are spaced apart from each other by a fourth doped region 634 and a second doped region 632 formed in the fourth doped region 634. In other words, the first gate group 612 is positioned in between the drain region 620D and the fourth doped region 634, and the second gate group 614 is positioned in between the fourth doped region 634 and the source region 620S. The second doped region 632 includes the second conductivity type and the fourth doped region 634 includes the first conductivity type. In the preferred embodiment, the first gate group 612 further includes a single gate structure 612 while the second gate group 614 includes a first gate structure 614a and a second gate structure 614b. A third doped region 618 including the first conductivity type is formed in between the first gate structure 614a and the second gate structure 614b of the second gate group 614 so that the first gate structure 614a and the second gate structure 614b are spaced apart from each other by the third doped region 618. However, the first gate structure 614a and the second gate structure 614b are electrically connected to each other by the third doped region 618. Particularly speaking, the first gate structure 614a is positioned in between the fourth doped region 618 and the third doped region 618D while the second gate structure 614b is positioned in between the third doped region 618 and the source region 620S. It is well-known to those skilled in the art that the single gate structure 612, the first gate structure 614a, and the second gate structure 614b respectively include a gate conductive layer and a gate dielectric layer, and since materials for the gate conductive layer and the gate dielectric layer are well-known to those skilled in the art, those details are omitted in the interest of brevity. Furthermore, the ESD protection semiconductor device 600 includes an isolation structure 604 and a guard ring 606 including the second conductivity type. The isolation structure 604 and the guard ring 606 surround the ESD protection semiconductor device 600 and electrically isolate the ESD protection semiconductor device 600 from other device. In the preferred embodiment, the isolation structure 604 preferably includes a STI structure, but not limited to this.

Please still refer to FIG. 9A. In the ESD protection semiconductor device 600 provided by the preferred embodiment, the first doped region 630 is positioned in a center of the drain region 620D and the second doped region 632 is also positioned in a center of the source region 620S, but not limited to this. The modifications to the arrangement of the first doped region 630 and the drain region 620D and to the arrangement of the second doped region 632 and the source region 620S are exemplarily shown in FIGS. 3-5 as and have been described in the aforementioned modifications therefore those details are omitted for simplicity. It is noteworthy that though the first doped region 630 is formed in the drain region 620D, the first doped region 630 is spaced apart from the drain region 620D by a first blocking structure 640. In the same concept, though the second doped region 632 is formed in the source region 620S, the second doped region 632 is spaced apart from the source region 620S by a second blocking structure 642. As shown in FIG. 9A, the first blocking structure 640 surrounds the first doped region 630 and therefore isolates the first doped region 630 from the drain region 620D. Also, the second blocking structure 642 surrounds the second doped region 632 and therefore isolates the second doped region 632 from the source region 620S. In the preferred embodiment, the first blocking structure 640 and the second blocking structure 642 include STI structure. However, the first blocking structure 640 and the second blocking structure 642 can include dummy gate structure or SAB structure.

More important, the first doped region 630 formed in the drain region 620D and the second doped region 632 formed in the source region 620S are electrically connected to each other as shown in FIG. 9A. Furthermore, the first gate group 612 (that is the single gate structure 612) is electrically connected to a first power supply pad VDD1, the first gate structure 614a of the second gate group 614 is electrically connected to a second power supply pad VDD2, and the second gate structure 614b of the second gate group 614 is electrically connected to a signal input pad IN. The source region 620S and the guard ring 606 are electrically connected to a ground pad GND, and the drain region 620D is electrically connected to an input/output pad I/O. As shown in FIG. 9A and FIG. 9B, when an ESD event occurs, the n-drain region 620D, the p-well region 602 and the p-typed first doped region 630 construct a diode, and this diode is self-triggered during the ESD event. Consequently, the ESD current is bypassed from the drain region 620D to the first doped region 630 and to the second doped region 632 as arrow "a" depicted. In other words, the preferred embodiment provides a self-triggered structure (including the diode) for bypassing the ESD currents. However, it should be easily realized to those skilled in the art that the electrical relationship between the gate structures, the power supply pads, the signal input pads and the ground pads can be modified according to different requirements and thus it is not limited to this.

Accordingly, the ESD protection semiconductor device 600 provided by the preferred embodiment is a multi-gate transistor including a self-triggered structure, and the gate structures can be grouped according to different product requirements. The self-triggered structure is a diode constructed by the first doped region 630 formed in the drain region 620D and the second doped region 632 formed in the drain region 620D. And the first doped region 630 is electrically connected to the second doped region 632. Consequently, the ESD currents can be bypassed by the self-triggered diode. Since the self-triggered diode serves as the bypass for ESD, damage caused by ESD event is avoided and thus device robustness of the ESD protection semiconductor device 600 is improved. More important, since the bypass is a self-triggered structure, no leakage is found when the ESD protection semiconductor device 600 is turned off. Additionally, according to the preferred embodiment, formation of the first doped region 630 and the second doped region 632 can be integrated in the state-of-the-art semiconductor manufacturing process without increasing process complexity and cost.

According to the ESD protection semiconductor device provided by the present invention, the first doped region formed in the drain region and the second doped region formed in the substrate construct a self-triggered structure, therefore the threshold voltage of the ESD protection semiconductor device is reduced while the turn-on speed and the device robustness of the ESD protection semiconductor device are improved. Furthermore, the ESD protection semiconductor device provided by the present invention includes the gate set, and the gate set can include the single gate, the multi gate, or the multi gate group. Therefore, the ESD protection semiconductor device provided by the present invention is able to be integrated into single-gate MOS transistor device, cascode transistor device, multi-gate MOS transistor. Additionally, by forming well regions of different conductivity types in the substrate, the ESD protection semiconductor device provided by the present invention is able to be integrated with LDMOS transistor approach. In other words, the ESD protection semiconductor device provided by the present invention is able to be integrated with various transistor approaches, thus product flexibility and functionality of the ESD protection semiconductor device are both improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection semiconductor device, comprising:
    a substrate;
    a well region formed in the substrate;
    a gate set positioned on the substrate;
    a source region and a drain region formed in the well region respectively at two sides of the gate set, wherein the source region and the drain region are of a first conductivity type, the drain region is equipotentially connected to an input/output pad, and the source region is equipotentially connected to a ground pad;
    at least a first doped region of a second conductivity type formed enclosed within the drain region and isolated from the drain region by being completely surrounded by a first blocking structure, wherein the first conductivity and the second conductivity type are complementary; and
    at least a second doped region of the second conductivity type formed enclosed within the source region and isolated from the source region by being completely surrounded by a second blocking structure, wherein the first doped region and the second doped region are equipotentially connected to each other.

2. The ESD protection semiconductor device according to claim 1, wherein the first blocking structure and the second blocking structure comprise shallow trench isolation (STI) structure.

3. The ESD protection semiconductor device according to claim 1, wherein the first doped region is positioned in a center of the drain region.

4. The ESD protection semiconductor device according to claim 1, wherein the first doped region is composed of at least a pair of sub-first doped regions.

5. The ESD protection semiconductor device according to claim 4, wherein the sub-first doped regions are positioned at two opposite ends of the drain region, respectively.

6. The ESD protection semiconductor device according to claim 1, wherein the gate set comprises a single gate structure, the single gate structure and the source region are equipotentially connected to the ground pad.

7. The ESD protection semiconductor device according to claim 1, wherein the gate set comprises:
    a third doped region comprising the first conductivity type;
    a first gate structure positioned on the substrate and between the third doped region and the drain region; and
    a second gate structure positioned on the substrate and between the third doped region and the source region.

8. The ESD protection semiconductor device according to claim 7, wherein the first gate structure and the second gate structure are spaced apart from each other by the third doped region, and the first gate structure and the second gate structure are electrically connected to each other by the third doped region.

9. The ESD protection semiconductor device according to claim 7, wherein the first gate structure is electrically connected to a power supply (Vdd) pad, the second gate structure and the source region are electrically connected to a ground pad, and the drain region is electrically connected to an I/O pad.

10. The ESD protection semiconductor device according to claim 1, wherein the gate set comprises:
    a first gate structure positioned on the substrate;
    a second gate structure positioned on the substrate;
    a third gate structure positioned on the substrate; and
    two third doped regions respectively formed in between the first gate structure and the second gate structure and in between the second gate structure and the third gate structure, the third doped regions comprising the first conductivity type,
    wherein the first gate structure, the second gate structure, and the third gate structure are spaced apart from each other by the third doped regions, and the first gate structure, the second gate structure, and the third gate structure are electrically connected to each other by the third doped regions.

11. The ESD protection semiconductor device according to claim 10, wherein the drain region and the first gate structure are electrically connected to power supply pad, the second gate structure is electrically connected to another power supply pad or a signal input pad, the third gate structure is electrically connected to a signal input pad or a ground pad, and the source region is electrically connected to a ground pad.

12. The ESD protection semiconductor device according to claim 1, wherein the gate set comprises:
   a first gate group positioned on the substrate;
   a second gate group positioned on the substrate, the first gate group is spaced apart from the second gate group;
   a third doped region comprising the first conductivity type, the third doped region being alternatively formed in the first gate group or in the second gate group; and
   a fourth doped region comprising the first conductivity type, the fourth doped region being formed in between the first gate group and the second gate group, and the second doped region being formed in the fourth doped region.

13. The ESD protection semiconductor device according to claim 12, wherein the second doped region is spaced apart from the fourth doped region.

14. The ESD protection semiconductor device according to claim 12, wherein the third doped region is formed in the first gate group, and the first gate group comprises a first gate structure and a second gate structure, the first gate structure and the second gate structure are spaced apart from each other by the third doped region and electrically connected to each other by the third doped region.

15. The ESD protection semiconductor device according to claim 13, wherein the third doped region is formed in the second gate group, and the second gate group comprise a first gate structure and a second gate structure, the first gate structure and the second gate structure are spaced apart from each other by the third doped region and electrically connected to each other by the third doped region.

* * * * *